United States Patent
He

(10) Patent No.: US 8,604,486 B2
(45) Date of Patent: Dec. 10, 2013

(54) ENHANCEMENT MODE GROUP III-V HIGH ELECTRON MOBILITY TRANSISTOR (HEMT) AND METHOD FOR FABRICATION

(75) Inventor: Zhi He, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 37 days.

(21) Appl. No.: 13/157,562

(22) Filed: Jun. 10, 2011

(65) Prior Publication Data

US 2012/0313106 A1 Dec. 13, 2012

(51) Int. Cl.
*H01L 31/0256* (2006.01)

(52) U.S. Cl.
USPC .............. 257/76; 257/24; 257/194; 438/172; 438/496

(58) Field of Classification Search
USPC .............. 257/24, 76, 194, 201; 438/172, 604
See application file for complete search history.

(56) References Cited

U.S. PATENT DOCUMENTS

| | | | |
|---|---|---|---|
| 6,246,077 B1 * | 6/2001 | Kobayashi et al. | 257/77 |
| 2004/0264270 A1 * | 12/2004 | Iwata et al. | 365/200 |
| 2010/0127275 A1 * | 5/2010 | Takehiko et al. | 257/76 |
| 2010/0308375 A1 * | 12/2010 | Birkhahn | 257/194 |
| 2011/0114967 A1 * | 5/2011 | Hikita et al. | 257/76 |
| 2012/0153351 A1 * | 6/2012 | Chandolu et al. | 257/192 |
| 2012/0193637 A1 * | 8/2012 | Kalnitsky et al. | 257/76 |

* cited by examiner

*Primary Examiner* — Phuc Dang
(74) *Attorney, Agent, or Firm* — Farjami & Farjami LLP

(57) ABSTRACT

According to one disclosed embodiment, an enhancement mode high electron mobility transistor (HEMT) comprises a heterojunction including a group III-V barrier layer situated over a group III-V semiconductor body, and a gate structure formed over the group III-V barrier layer and including a P type group III-V gate layer. The P type group III-V gate layer prevents a two dimensional electron gas (2 DEG) from being formed under the gate structure. One embodiment of a method for fabricating such an enhancement mode HEMT comprises providing a substrate, forming a group III-V semiconductor body over the substrate, forming a group III-V barrier layer over the group III-V semiconductor body, and forming a gate structure including the P type group III-V gate layer over the group III-V barrier layer.

20 Claims, 6 Drawing Sheets

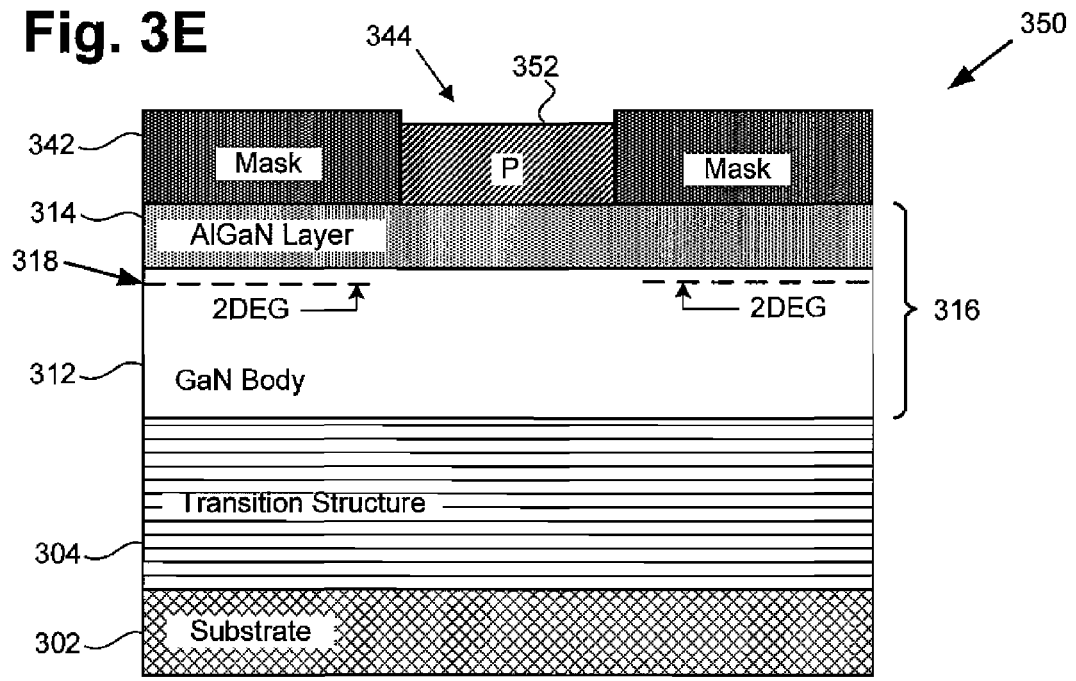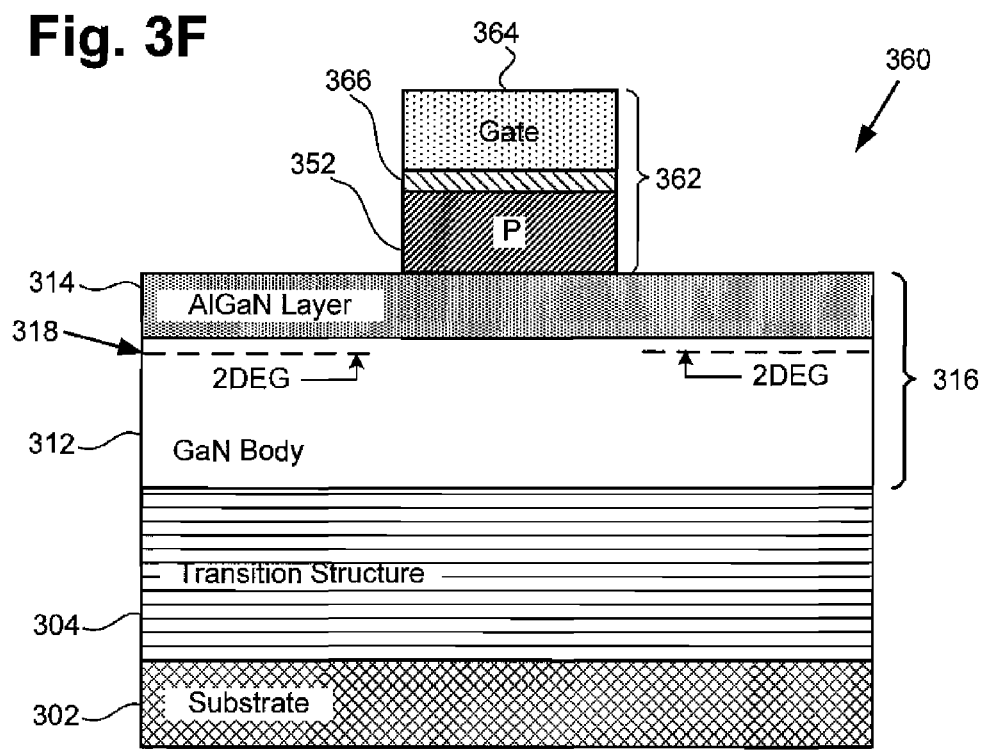

ENHANCEMENT MODE GROUP III-V HIGH ELECTRON MOBILITY TRANSISTOR (HEMT) AND METHOD FOR FABRICATION

BACKGROUND OF THE INVENTION

Definition

In the present application, "group III-V semiconductor" refers to a compound semiconductor that includes at least one group III element and at least one group V element, such as, but not limited to, gallium nitride (GaN), aluminum gallium nitride (AlGaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

1. FIELD OF THE INVENTION

The present invention is generally in the field of semiconductors. More specifically, the present invention is in the field of group III-V high electron mobility transistor (HEMT) fabrication.

2. BACKGROUND ART

High electron mobility transistors (HEMTs) utilizing group III-V heterojunction structures, such as III-nitride heterojunctions, typically operate using piezoelectric polarization fields to generate a two dimensional electron gas (2DEG) that allows for high current densities with low resistive losses. The 2DEG can arise naturally at an interface of the III-nitride materials forming the heterojunction and, due to the 2DEG, conventional III-nitride HEMTs typically conduct without the application of a gate potential. That is to say, conventional III-nitride and other group III-V HEMTs tend to be normally ON, or depletion mode devices.

Although due to their high breakdown voltage, high current density, and low ON resistance, III-nitride HEMTs are advantageous when used in power applications, the normally ON nature of conventional III-nitride HEMT structures can introduce problems when such depletion mode transistors are used as power devices. For example, in power applications it is desirable to avoid conducting current through the III-nitride HEMTs before control circuitry is fully powered and operational. Accordingly, it would be desirable to provide III-nitride HEMTs that are normally OFF, or enhancement mode transistors to, for example, avoid current conduction problems during start-up and other circuit transitions.

Thus, there is a need to overcome the drawbacks and deficiencies in the art by providing a solution enabling fabrication of an enhancement mode group III-V HEMT, i.e. a normally OFF group III-V HEMT, suitable for use in power applications.

SUMMARY OF THE INVENTION

The present invention is directed to an enhancement mode group III-V high electron mobility transistor (HEMT) and method for fabrication, substantially as shown in and/or described in connection with at least one of the figures, as set forth more completely in the claims.

BRIEF DESCRIPTION OF THE DRAWINGS

FIG. 3E shows a cross-sectional view of a structure corresponding to an enhancement mode group III-V HEMT at an intermediate fabrication stage, according to one embodiment of the present invention.

FIG. 3F shows a cross-sectional view of a structure corresponding to an enhancement mode group III-V HEMT prior to a final fabrication stage, according to one embodiment of the present invention.

DETAILED DESCRIPTION OF THE INVENTION

Figure 1:
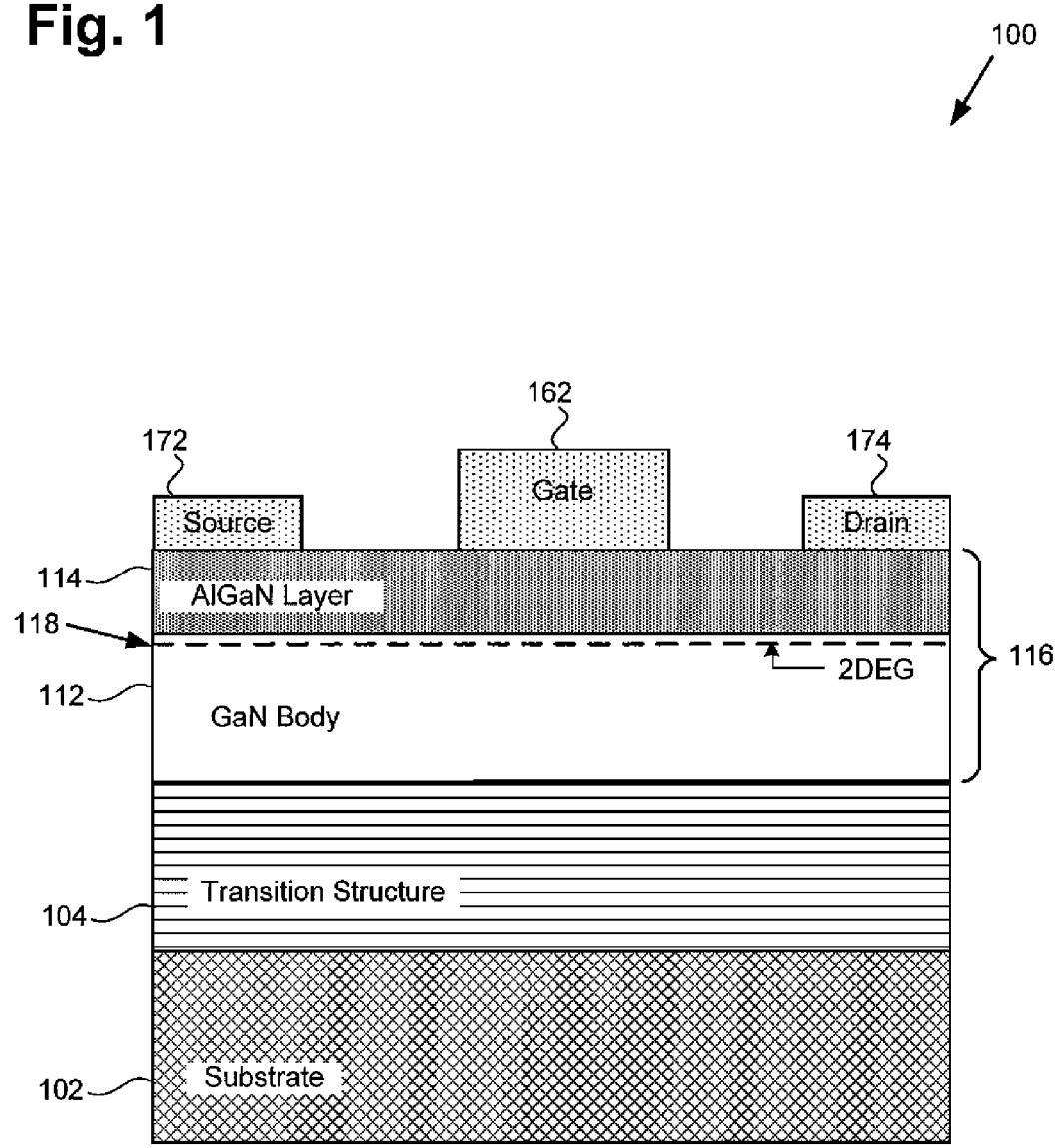
FIG. 1 shows a cross-sectional view of a structure corresponding to a conventional depletion mode group III-V high electron mobility transistor (HEMT), representing its normally ON state.

The present invention is directed to an enhancement mode group high electron mobility transistor (HEMT) and method for fabrication. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

FIG. 1 is a cross-sectional view of a structure corresponding to a conventional depletion mode group III-V HEMT, showing its normally ON state. As shown in FIG. 1, structure 100 comprises a III-nitride HEMT implemented as a gallium nitride (GaN) device. Structure 100 includes support substrate 102, transition structure 104, heterojunction 116 comprising GaN body 112 and aluminum gallium nitride (AlGaN) barrier layer 114, source contact 172, drain contact 174, and gate 162. Also shown in FIG. 1 is two dimensional electron gas (2DEG) 118, which provides a conduction channel for the charge carriers of the HEMT and is generated at the interface of GaN body 112 and AlGaN barrier layer 114, in heterojunction 116. As illustrated by FIG. 1, in an undisturbed state, 2DEG 118 produced by heterojunction 116 provides a continuous, uninterrupted channel for the flow of current between source contact 172 and drain contact 174. That is to say, the conventional III-nitride HEMT comprised by conventional structure 100 is a normally ON, depletion mode, device.

As previously explained, although III-nitride HEMTs, such as the GaN HEMT comprised of conventional structure 100 in FIG. 1, are advantageous for use in power applications due to their high breakdown voltage, high current density, and low ON resistance, their normally ON nature can introduce problems in power applications. For power applications, it is desirable to avoid conducting current through the III-nitride HEMT before control circuitry is fully powered and operational, in order to avoid current conduction problems during start-up and other circuit conditions.

Figure 2:
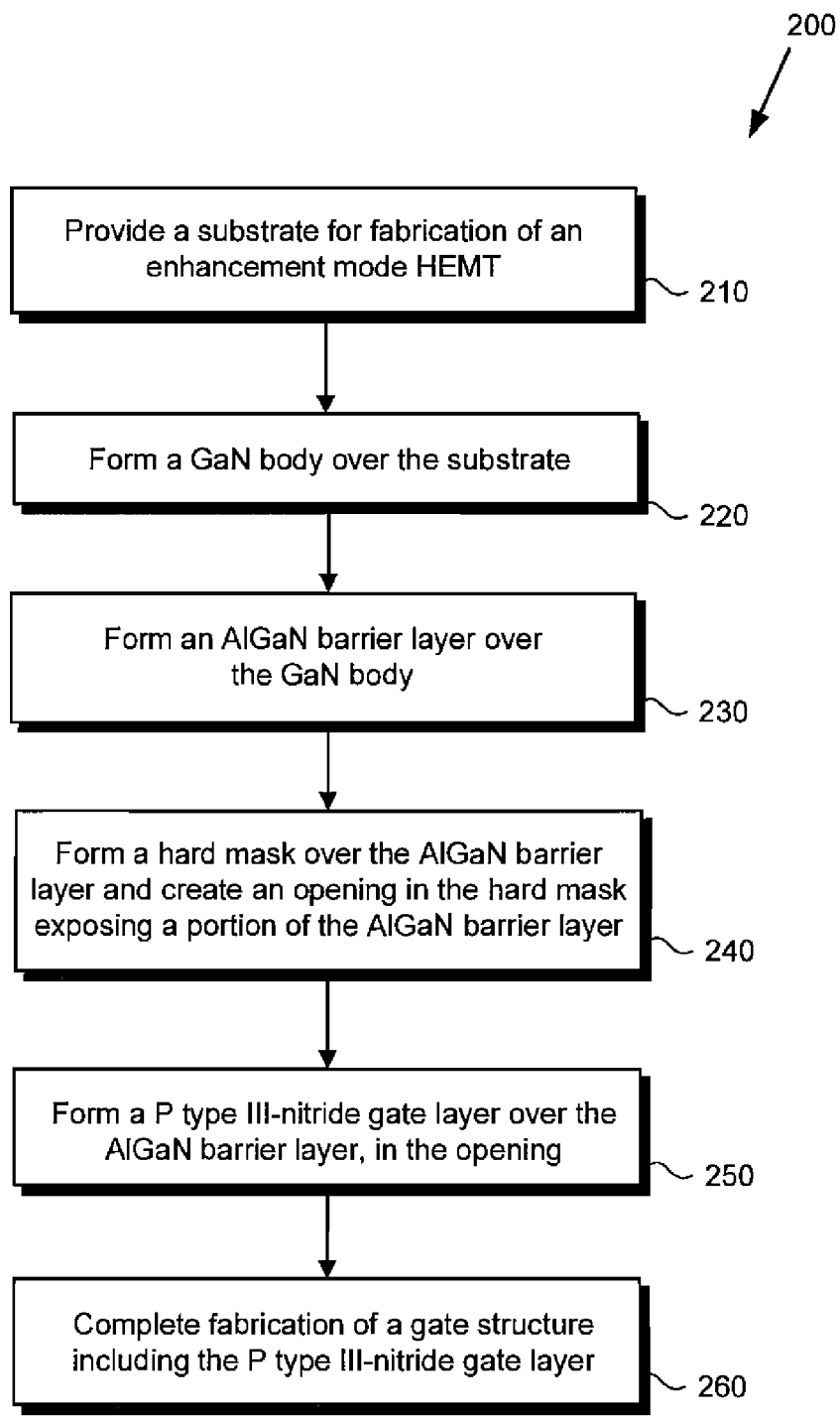
FIG. 2 is a flowchart presenting a method for fabricating an enhancement mode group III-V high electron mobility transistor (HEMT), according to one embodiment of the present invention.

Referring to FIG. 2, FIG. 2 shows flowchart 200 presenting a method, according to one embodiment of the present invention, for fabricating an enhancement mode group III-V HEMT configured to overcome the drawbacks and deficiencies associated with conventional structure 100, in FIG. 1. Certain details and features have been left out of flowchart 200 that are apparent to a person of ordinary skill in the art. For example, a step may comprise one or more substeps or may involve specialized equipment or materials, as known in the art. Moreover, while steps 210 through 260 indicated in flowchart 200 are sufficient to describe one embodiment of the present invention, other embodiments of the invention may utilize steps different from those shown in flowchart 200, and may include more, or fewer, steps.

Figure 3A:
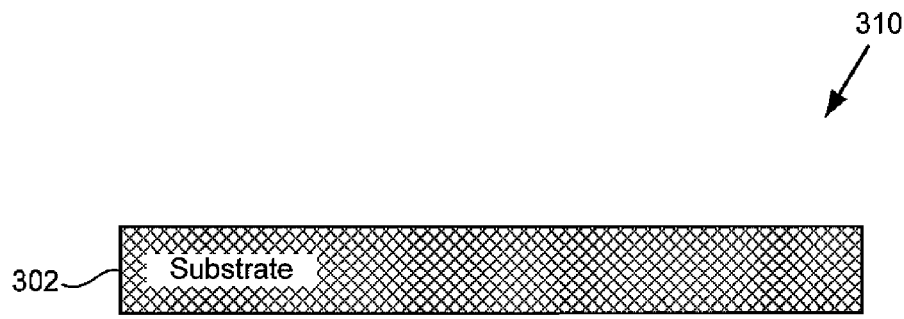
FIG. 3A shows a cross-sectional view of a structure corresponding to an enhancement mode group III-V HEMT at an initial fabrication stage, according to one embodiment of the present invention.

Referring now to FIG. 3A, structure 310 of FIG. 3A corresponds to a cross-sectional view of an enhancement mode group III-V HEMT at an initial fabrication stage, according to one embodiment of the present invention. Structure 310 shows substrate 302 suitable for use as a support substrate for an enhancement mode group III-V HEMT. In particular, FIG. 3A shows structure 310 at a stage of fabrication following processing step 210 of flowchart 200.

Proceeding on to FIGS. 3B, 3C, 3D, 3E, and 3F, structures 320, 330, 340, 350, and 360 show the result of performing, on structure 310, steps 220, 230, 240, 250, and 260 of flowchart 200 of FIG. 2, respectively. For example, structure 320 shows structure 310 following processing step 220, structure 330 shows structure 310 following processing step 230, and so forth. It is noted that the structures shown in FIGS. 3A through 3F, as well as that shown in FIG. 4, are provided as specific implementations of the present inventive principles, and are shown with such specificity for the purposes of conceptual clarity. It should also be understood that particular details such as the materials used to form structures 310 through 360 and 400, and the techniques used to produce the various depicted features, are being provided as examples, and should not be interpreted as limitations.

Beginning with step 210 in FIG. 2 and structure 310 in FIG. 3A, step 210 of flowchart 200 comprises providing substrate 302 for fabrication of an enhancement mode group III-V HEMT. Substrate 302 may comprise any material suitable for use as a substrate for fabrication of a group III-V semiconductor device. For example, substrate 302 may comprise silicon (Si), silicon carbide (SiC), or sapphire. Alternatively, in some embodiments, substrate 302 may comprise a native substrate for the materials from which the group III-V semiconductor device is to be fabricated, and may be a native GaN or other III-nitride substrate, for instance. Moreover, although substrate 302 is shown as a substantially unitary substrate, in other embodiments, substrate 302 may correspond to a semiconductor on insulator substrate such, as a silicon on insulator (SOI) or germanium on insulator (GOI) substrate, for example.

Figure 3B:
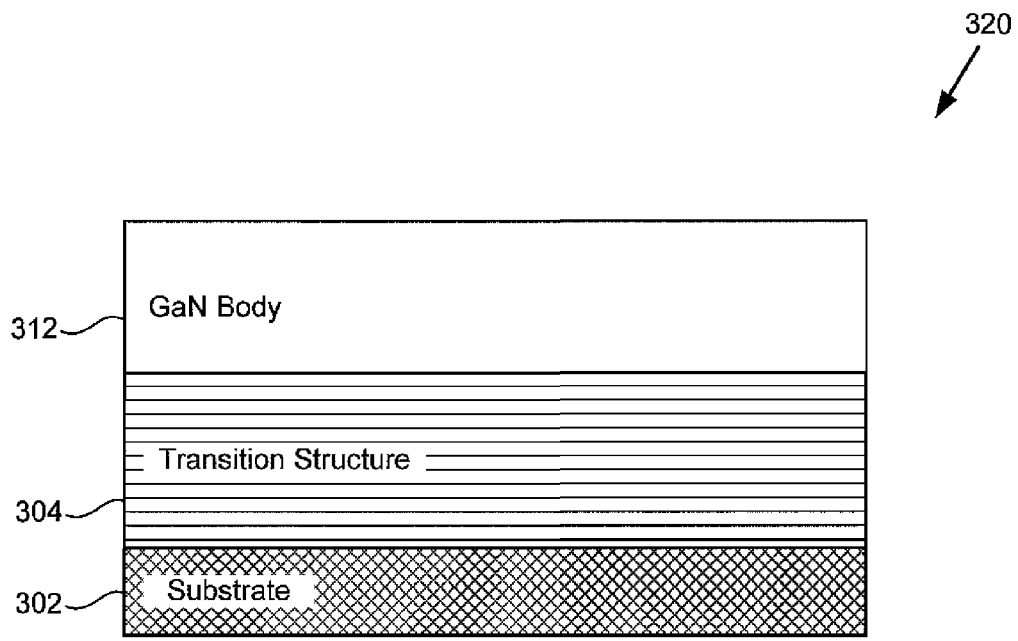
FIG. 3B shows a cross-sectional view of a structure corresponding to an enhancement mode group III-V HEMT at an intermediate fabrication stage, according to one embodiment of the present invention.
Figure 4:
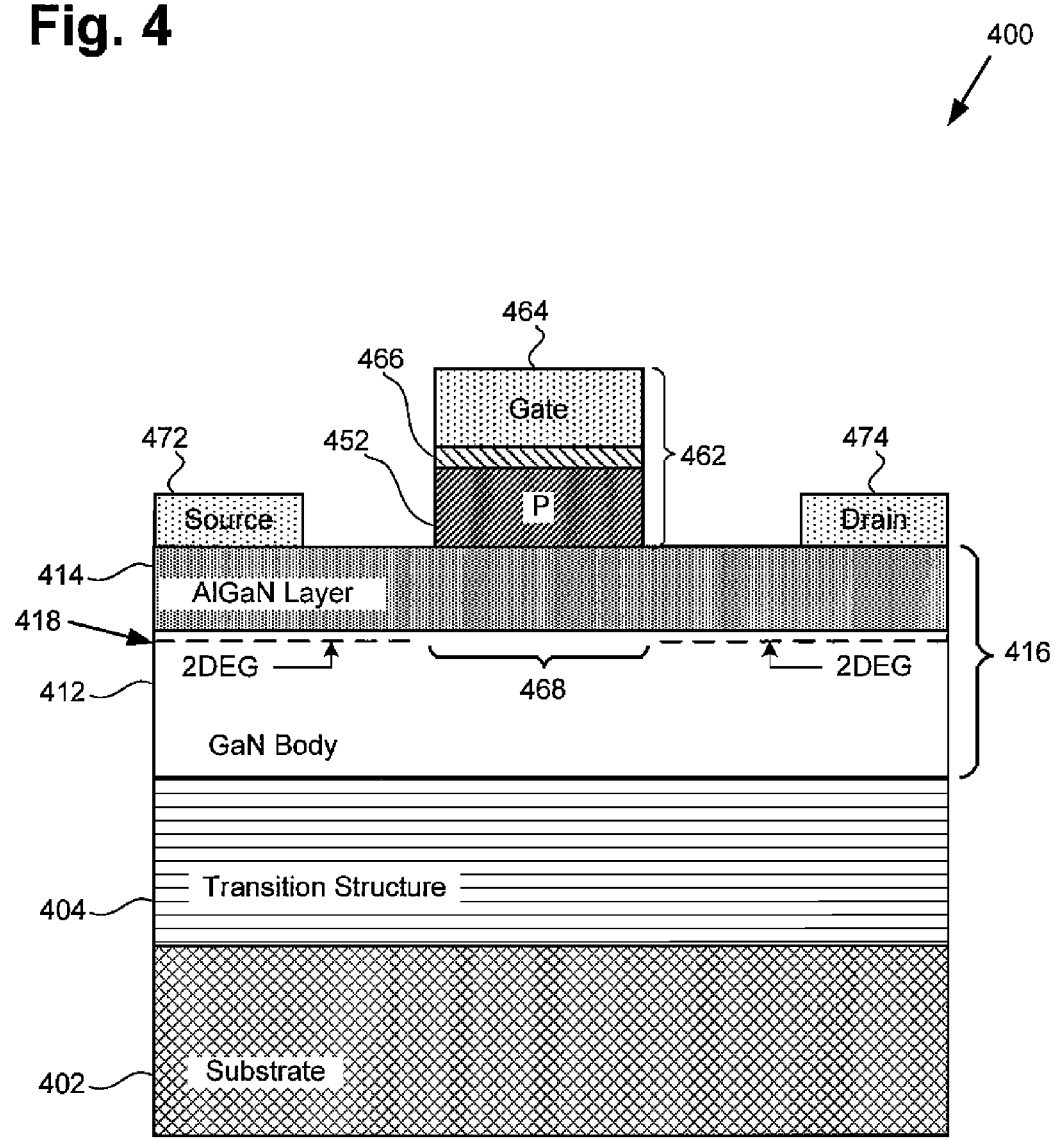
FIG. 4 shows a cross-sectional view of a structure corresponding to an enhancement mode group III-V HEMT, according to one embodiment of the present invention.

Continuing on to step 220 in FIG. 2 and structure 320 in FIG. 3B, step 220 of flowchart 200 comprises forming GaN body 312 over substrate 302. As shown in FIG. 3B, in embodiments of the present method wherein a native substrate is not used for fabrication of the enhancement mode HEMT, transition structure 304 may be formed between substrate 302 and GaN body 312. As a specific example, where substrate 302 is a silicon substrate, transition structure 304 may correspond to a plurality of distinguishable layers mediating the lattice transition from substrate 302 to GaN body 312, thereby reducing lattice mismatch between substrate 302 and GaN body 312. For instance, transition structure 304 may include an aluminum nitride (AlN) layer formed on substrate 302, and a series of AlGaN layers comprising progressively less aluminum and more gallium, until a suitable transition to GaN body 312 is achieved.

GaN body 312 may be formed over substrate 302 using any of a number of conventional growth techniques. For example, GaN body 312 may be formed over transition structure 304 using molecular-beam epitaxy (MBE), metalorganic chemical vapor deposition (MOCVD), or hydride vapor phase epitaxy (HVPE), to name a few suitable approaches.

Figure 3C:
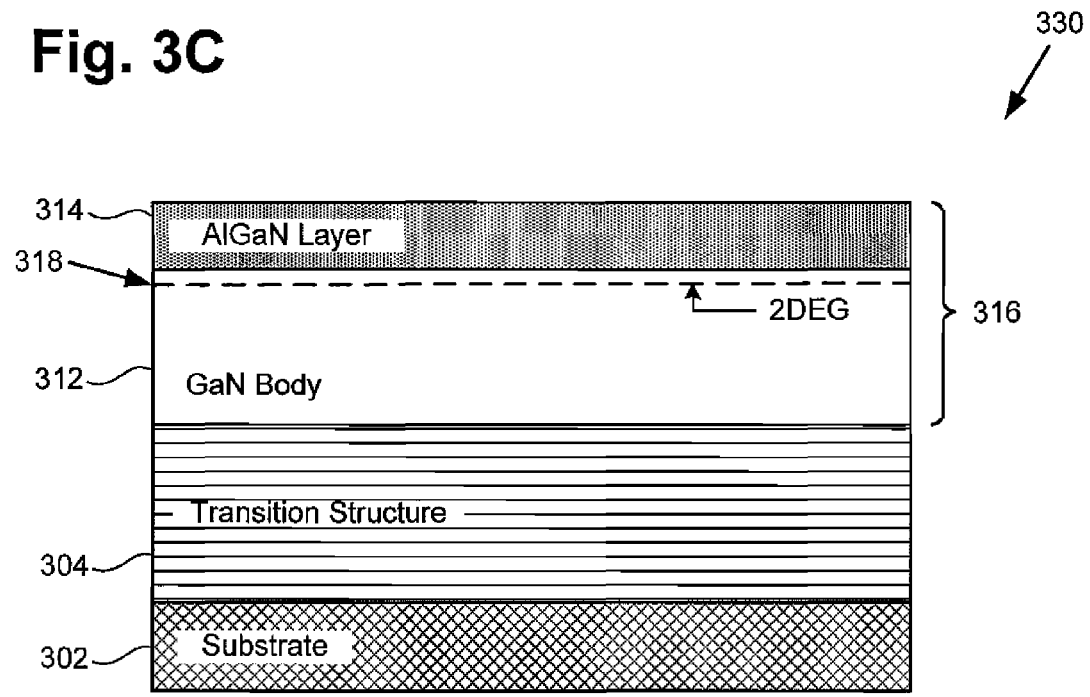
FIG. 3C shows a cross-sectional view of a structure corresponding to an enhancement mode group III-V HEMT at an intermediate fabrication stage, according to one embodiment of the present invention.

Referring to step 230 of FIG. 2 and structure 330 in FIG. 3C, step 230 of flowchart 200 comprises forming AlGaN barrier layer 314 over GaN body 312, thereby forming heterojunction 316 giving rise to 2DEG 318. As was the case for step 220, in step 230, AlGaN barrier layer 314 may be formed over GaN body 312 using any of MBE, MOCVD, or HVPE, for example. Heterojunction 316 including GaN body 312 and AlGaN barrier layer 314 may be undoped, in which case defects typically produced during growth of GaN body 312 and AlGaN barrier layer 314 result in heterojunction 316 being characterized by a light N type conductivity. Alternatively, heterojunction 316 may intentionally include an N type conductivity GaN body 312 and/or an N type conductivity AlGaN barrier layer 314.

It is noted that, as is true for all of FIGS. 3A through 3F and FIG. 4, FIG. 3C is not necessarily drawn to scale. For instance, although GaN body 312 and AlGaN barrier layer 314 are shown as having comparable thicknesses as a visual aid, those features will typically have distinctly different respective thicknesses, such as a thicknesses up to approximately 10 µm for GaN body 312 and a thickness of less than approximately 50 nm for AlGaN barrier layer 314, for example. It is further noted that although the embodiments shown in FIGS. 3A through 3F and FIG. 4 represent fabrication of an enhancement mode HEMT in GaN, typically the only constraints placed upon the constituents of heterojunction 316 are that barrier layer 314 comprise a group III-V semiconductor having a wider band gap than the group III-V semiconductor forming body 312, and that both group III-V semiconductors be selected so as to produce 2DEG 318 at their heterojunction interface. Such a heterojunction may be formed using GaN, as represented in the present figures, or any other suitable group III-V semiconductor materials, as described in the "Definition" section above.

Figure 3D:
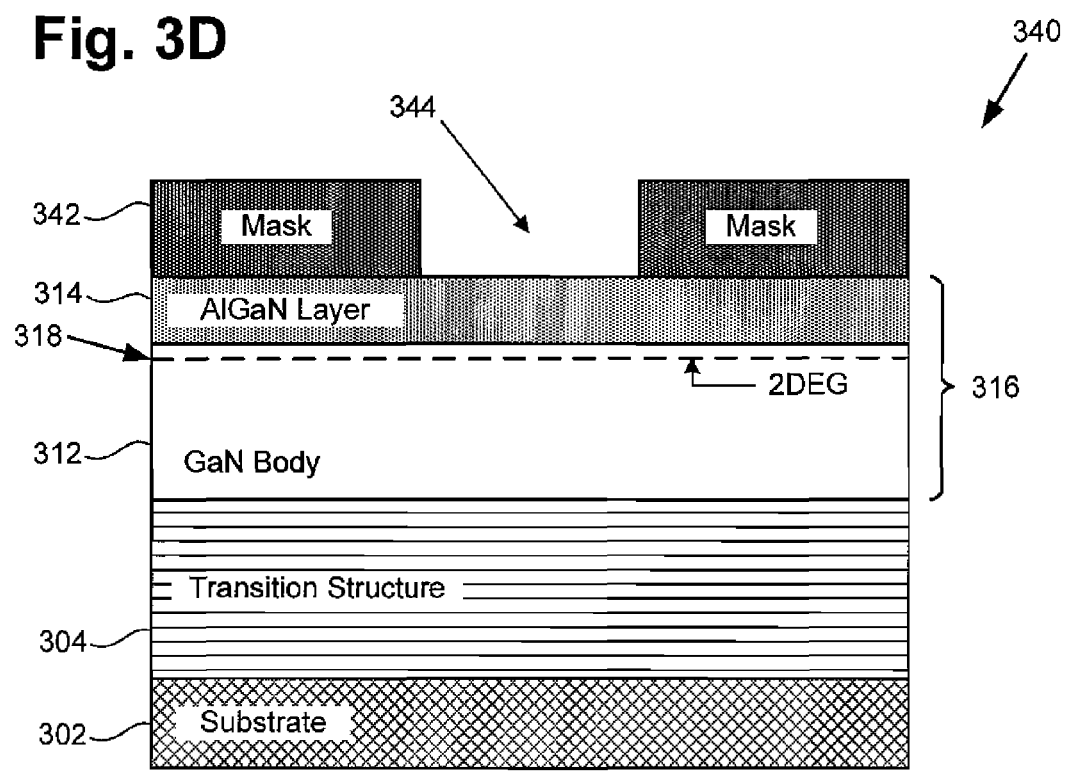
FIG. 3D shows a cross-sectional view of a structure corresponding to an enhancement mode group III-V HEMT at an intermediate fabrication stage, according to one embodiment of the present invention.

Continuing now to step 240 in FIG. 2 and structure 340 in FIG. 3D, step 240 of flowchart 200 comprises forming hard mask 342 over AlGaN barrier layer 314 and creating opening 344 in hard mask 342 so as to expose a portion of AlGaN barrier layer 314. Hard mask 342 may comprise silicon dioxide ($SiO_2$) or silicon nitride ($Si_3N_4$), for example, and may be deposited over AlGaN barrier layer 314 using a plasma enhanced chemical vapor deposition (PECVD) process. Hard mask 342 may be further processed to define opening 344, through an etch process, for example. It is noted that although masking of AlGaN barrier layer 314, in step 240 of flowchart 200, is characterized as being performed using hard mask 342 in the present embodiment, more generally, masking may be performed using either a hard mask, as represented in FIG. 2, or using a soft mask material, such as photoresist or another type of polymer mask, for example.

Moving on to step 250 of flowchart 200 and structure 350 in FIG. 3E, step 250 of flowchart 200 comprises selectively forming P type III-nitride gate layer 352 over AlGaN barrier layer 314, in opening 344. According to the features represented by the embodiment shown in FIGS. 3A through 3F and FIG. 4, P type III-nitride gate layer 352 may comprise P type AlGaN or P type GaN, for example. However, more generally, and depending upon the materials used to form heterojunction 316, a P type gate layer corresponding to P type III-nitride gate layer 352 may comprise any suitable P type group III-V semiconductor material.

P type III-nitride gate layer 352 may be selectively formed in opening 344 using an MOCVD process, for example. As shown in FIG. 3E, the presence of P type III-nitride gate layer 352 over AlGaN barrier layer 314 interrupts 2DEG 318 under P type III-nitride gate layer 352. As may be understood by one of ordinary skill in the art, disposition of P type III-nitride gate layer 352 over at least nominally N type AlGaN barrier layer 314 produces a PN junction that substantially depletes 2DEG 318 under P type III-nitride gate layer 352, thereby preventing formation of 2DEG 318 under the P type gate layer 352.

Although the present method characterizes P type III-nitride gate layer 352 as being formed by selective growth of a P type semiconductor material in opening 344 of hard mask 342, other approaches to forming P type III-nitride gate layer 352 are contemplated by the present inventor. For example, in an alternative embodiment, steps 210-230 may be followed by formation of a P type III-nitride material layer, for example as a blanket layer over AlGaN barrier layer 314. Such a layer of P type III-nitride material could then be suitably masked to protect a region of the P type III-nitride material layer corresponding to P type III-nitride gate layer 352, and the unprotected portions of the P type III-nitride material layer could be removed, leaving P type III-nitride gate layer 352.

Proceeding to step 260 of flowchart 200 and referring to FIG. 3F, step 260 of flowchart 200 comprises completing fabrication of gate structure 362, which includes P type III-nitride gate layer 352. As shown in FIG. 3F, gate structure 362 comprises conductive gate electrode 364 formed over P type III-nitride gate layer 352. Conductive gate electrode 364 may comprise any suitable conductive material, such as doped polysilicon, for example, or a metal such as titanium (Ti) or aluminum (Al). In some embodiments, as shown by the exemplary representation in FIG. 3F, gate structure 362 may further comprise gate dielectric 366 formed over P type III-nitride gate layer 352. Gate dielectric 366 may be disposed between P type III-nitride gate layer 352 and conductive gate electrode 364, and may comprise aluminum oxide ($Al_2O_3$), silicon dioxide ($SiO_2$) or silicon nitride ($Si_3N_4$), for example.

Continuing now to FIG. 4, FIG. 4 shows a cross-sectional view of structure 400 corresponding to an enhancement mode group III-V HEMT, according to one embodiment of the present invention. Structure 400 may be fabricated according to the method of flowchart 200, in FIG. 2, for example, wherein the method of flowchart 200 further comprises forming respective ohmic source and drain contacts 472 and 474. In addition to source contact 472 and drain contact 474, structure 400 includes gate structure 462 formed over heterojunction 416 and preventing formation of 2DEG 418 under gate structure 462.

Gate structure 462, including P type III-nitride gate layer 452, conductive gate electrode 464, and gate dielectric 466, corresponds to gate structure 362 including P type III-nitride gate layer 352, conductive gate electrode 364, and gate dielectric 366, in FIG. 3F, while heterojunction 416 including GaN body 412, AlGaN barrier layer 414, and interrupted 2DEG 418, in FIG. 4, corresponds to heterojunction 316 including GaN body 312, AlGaN barrier layer 314, and interrupted 2DEG 318, in FIGS. 3E and 3F. Moreover, substrate 402 and transition structure 404, in FIG. 4, correspond respectively to substrate 302, shown in FIGS. 3A through 3F, and transition structure 304, shown in FIGS. 3B through 3F.

As illustrated in FIG. 4, and for the reasons previously described, in the absence of an applied gate voltage, inclusion of P type III-nitride gate layer 452 as part of gate structure 462 prevents 2DEG 418 from being formed under gate structure 462, resulting in 2DEG interruption 468. Consequently, the III-nitride HEMT shown in FIG. 4 is a normally OFF, or enhancement mode device. Affirmative application of a suitable gate voltage to conductive gate electrode 464 of gate structure 462 results in removal of 2DEG interruption 468 and establishment of a continuous high electron mobility 2DEG channel coupling source contact 472 and drain contact 474 through heterojunction 416 on an on-demand basis.

Thus, the concepts disclosed in the present application advantageously enable fabrication of an enhancement mode group III-V HEMT suitable for use in power applications. From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. An enhancement mode high electron mobility transistor (HEMT) comprising:
    a heterojunction including a group III-V barrier layer situated over a group III-V semiconductor body;
    a gate structure formed over said group III-V barrier layer, said gate structure including a P type group III-V gate layer formed on said group III-V barrier layer, and one of a conductive gate electrode and a gate dielectric formed directly on said P type group III-V gate layer, wherein said P type group III-V gate layer prevents a two dimensional electron gas (2DEG) from being formed in said heterojunction under said gate structure.

2. The enhancement mode HEMT of claim 1, wherein said heterojunction comprises a III-nitride heterojunction.

3. The enhancement mode HEMT of claim 1, wherein said P type group III-V gate layer comprises a P type III-nitride material.

4. The enhancement mode HEMT of claim 1, wherein said conductive gate electrode is formed on said P type group III-V gate layer.

5. The enhancement mode HEMT of claim 1, wherein said conductive gate electrode is selected from the group consisting of titanium (Ti), aluminum (Al), and doped polysilicon.

6. The enhancement mode HEMT of claim 1, wherein said gate dielectric is formed on said P type group III-V gate layer.

7. The enhancement mode HEMT of claim 1, wherein said gate dielectric is selected from the group consisting of aluminum oxide ($Al_2O_3$), silicon nitride ($Si_3N_4$), and silicon dioxide ($SiO_2$).

8. The enhancement mode HEMT of claim 1, wherein said group III-V semiconductor body comprises gallium nitride (GaN).

9. The enhancement mode HEMT of claim 1, wherein said group III-V barrier layer comprises aluminum gallium nitride (AlGaN).

10. The enhancement mode HEMT of claim 1, wherein said group III-V semiconductor body is formed over a substrate, and further comprising a transition structure for reducing a lattice mismatch between said substrate and said group III-V semiconductor body.

11. The enhancement mode HEMT of claim 1, wherein said group III-V semiconductor body is formed over a substrate selected from the group consisting of silicon (Si), silicon carbide (SiC), and sapphire.

12. A method for fabricating an enhancement mode high electron mobility transistor (HEMT), said method comprising:
    forming a group III-V semiconductor body over a substrate;
    forming a group III-V barrier layer over said group III-V semiconductor body;
    forming a gate structure over said group III-V barrier layer to prevent a two dimensional electron gas (2DEG) from being formed under said gate structure;
    said gate structure including a P type group III-V gate layer formed on said group III-V barrier layer, and one of a conductive gate electrode and a gate dielectric formed directly on said P type group III-V gate layer.

13. The method of claim 12, wherein forming said gate structure further comprises:
    forming a mask over said group III-V barrier layer;
    creating an opening in said mask to expose a portion of said group III-V barrier layer;
    forming said P type group III-V gate layer in said opening.

14. The method of claim 12, wherein forming said gate structure further comprises:
    forming a hard mask over said group III-V barrier layer;
    creating an opening in said hard mask to expose a portion of said group III-V barrier layer;
    forming said P type group III-V gate layer in said opening.

15. The method of claim 12, wherein said P type group III-V gate layer is formed using a metalorganic chemical vapor deposition (MOCVD) process.

16. The method of claim 12, wherein said P type group III-V gate layer comprises a P type III-nitride material.

17. The method of claim 12, further comprising forming a transition structure over said substrate before forming said group III-V semiconductor body, said transition structure reducing a lattice mismatch between said substrate and said group III-V semiconductor body.

18. The method of claim 12, wherein forming said gate structure comprises forming said gate dielectric on said P type group III-V gate layer, and further comprises forming said conductive gate electrode over said gate dielectric.

19. The method of claim 12, wherein said enhancement mode HEMT comprises a III-nitride HEMT.

20. The method of claim 12, wherein forming said group III-V barrier layer over said group III-V semiconductor body comprises forming an aluminum gallium nitride (AlGaN) barrier layer over a gallium nitride (GaN) semiconductor body.

* * * * *